United States Patent
Murata et al.

(10) Patent No.: US 6,929,971 B2
(45) Date of Patent: Aug. 16, 2005

(54) SEMICONDUCTOR DEVICE AND ITS MANUFACTURING METHOD

(75) Inventors: Kensho Murata, Beppu (JP); Mutsumi Masumoto, Beppu (JP); Kenji Masumoto, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/302,254

(22) Filed: Nov. 22, 2002

(65) Prior Publication Data

US 2003/0155652 A1 Aug. 21, 2003

Related U.S. Application Data

(62) Division of application No. 09/826,269, filed on Apr. 4, 2001, now Pat. No. 6,525,424.

(51) Int. Cl.$^7$ .............................................. H01L 21/00
(52) U.S. Cl. ..................... 438/64; 438/108; 438/613; 438/614
(58) Field of Search .................... 438/64, 108, 613, 438/614, 349, 700, 459, 703, 705, 737, 738, 772, 779, 784, 780; 257/459, 737, 738, 780

(56) References Cited

U.S. PATENT DOCUMENTS

| | | | |
|---|---|---|---|
| 6,181,569 B1 * | 1/2001 | Chakravorty | 361/761 |
| 6,271,588 B1 * | 8/2001 | Ohuchi | 257/734 |
| 6,320,250 B1 * | 11/2001 | Takahashi | 257/678 |
| 6,555,459 B1 * | 4/2003 | Tokushige et al. | 438/612 |
| 2001/0046764 A1 * | 11/2001 | Ohuchi | 438/613 |

* cited by examiner

Primary Examiner—David Nelms
Assistant Examiner—Long Tran
(74) Attorney, Agent, or Firm—W. Daniel Swayze, Jr.; W. James Brady; Frederick J. Telecky, Jr.

(57) ABSTRACT

Improve the productivity and cost for the manufacturing of a semiconductor device referred to as a wafer level CSP. The manufacturing method for a semiconductor device related to this invention contains each of the processes that form a wiring (18) for the purpose of electrically connecting each electrode pad (10a) and external connecting terminals on top of a wafer (10) on which semiconductor elements are formed, connect conductive balls that are preformed by a separate process on top of this, and next, cover the above-mentioned wafer with a resin (32) such that the upper portion of the conductive supporting posts (30) are exposed. In a later process, solder balls (34) are arranged as external connecting terminals on the upper portion of the conductive supporting posts, and in the final process, semiconductor elements are formed by dicing the above-mentioned wafer along the boundary lines of the above-mentioned semiconductor elements.

9 Claims, 5 Drawing Sheets

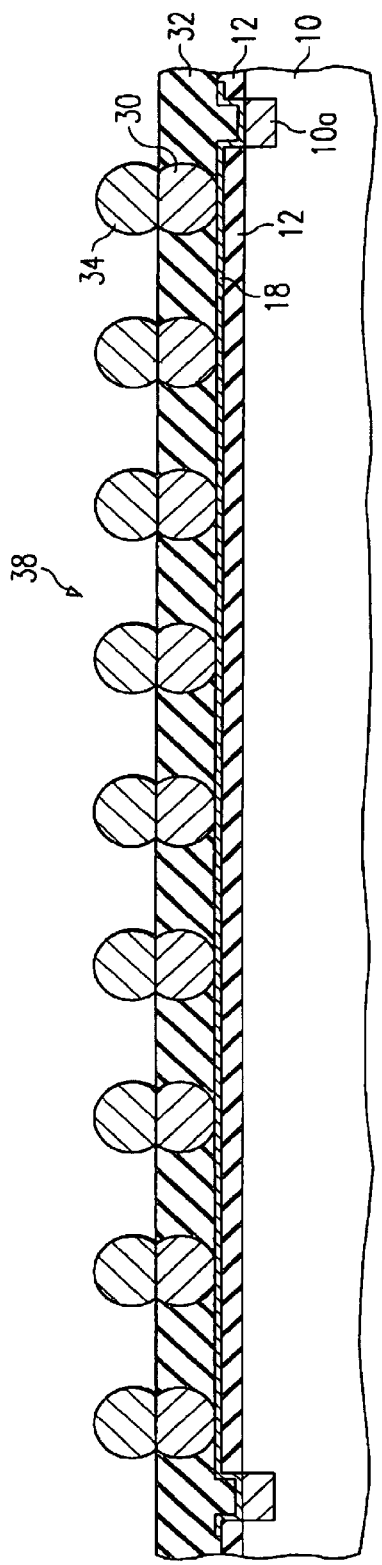
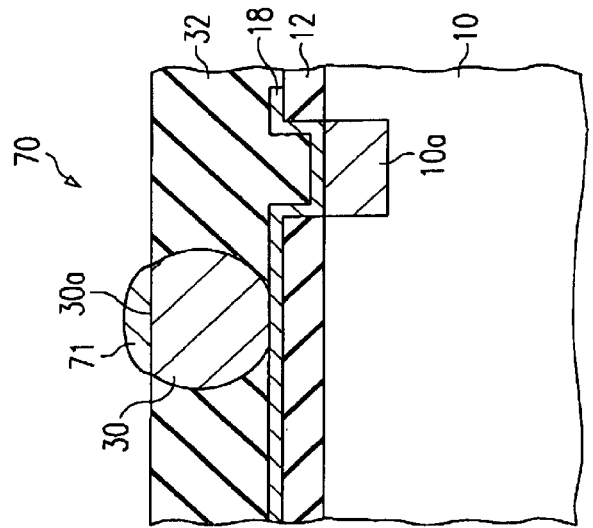
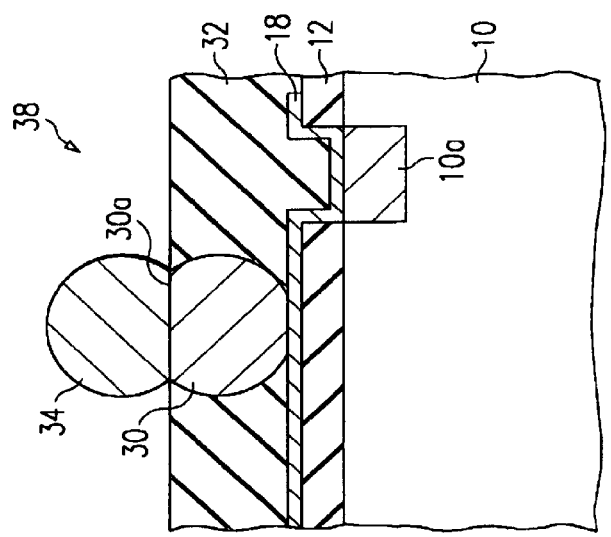
FIG. 5
FIG. 6
FIG. 7

SEMICONDUCTOR DEVICE AND ITS MANUFACTURING METHOD

This application is a divisional of application Ser. No. 09/826,269 filed Apr. 04, 2001, now U.S. Pat. No. 6,525,424, which claims priority from Japanese patent application serial number 2000-102429 filed Apr. 04, 2000.

FIELD OF THE INVENTION

This invention relates to a semiconductor device of the so-called wafer level CSP type and its manufacturing method in which the packaging of a semiconductor chip is realized in the wafer state.

BACKGROUND OF THE INVENTION

In the semiconductor device manufacturing industry, efforts are continuing for the purpose of further downsizing a single package semiconductor device. The initial effort for the purpose of realizing miniaturization of a semiconductor device reduced the size of the semiconductor chip itself. By making the semiconductor chip smaller, the number of chips that could be obtained from one wafer was increased, and along with bringing down manufacturing costs, since the movement distance of electrons between each element could be made shorter, the operating speed was increased. Due to the development of microscopic processing technology, decreasing the chip size for a semiconductor device having the same functions became possible. The current leading-edge design guideline is less than 0.18 $\mu$m, and by this means, it has become possible to place more than two million units on a single semiconductor chip.

In order to realize a miniaturization of the semiconductor device, the next effort involved making the size of the package in which a chip is sealed as close as possible to the size of the semiconductor chip it houses. As one result related to this effort, a type of semiconductor device was created called a chip size package (Chip Size Package:CSP) or a chip scale package (Chip Scale Package). The connecting terminals (for example, solder balls, hereinafter, called external connecting terminals) for the printed circuit board on which the semiconductor device is mounted form a two-dimensional arrangement on the face of a semiconductor chip, and was successful in bringing the size of the package close to the chip size. By decreasing the above-mentioned package size so as to approach the semiconductor chip size, along with the mounting surface area becoming small, the wiring length that connected the terminals on the chip and the external connecting terminals became short, and by this means, in the same manner as when decreasing the size of above-mentioned semiconductor chip itself, the operating speed of the semiconductor device was increased.

However, even when the package size was decreased, the manufacturing cost could not be lowered very much. Because various processes for the packaging were conducted for each individual semiconductor chip cut out from the wafer, even if the package size was decreased, because the number of processes was fixed, there were no changes in productivity.

With this background, technology that packages a semiconductor chip as is in the wafer state (hereinafter, called wafer level CSP) has been proposed, and development is continuing in the direction of its realization by individual companies. Semiconductor manufacturing technology that executes packaging at a stage before individual semiconductor chips are cut away from the wafer is referred to as wafer level CSP. In wafer level CSP, since the packaging process can be done as one unit with the wafer process, the packaging cost, and by extension, the manufacturing cost of the semiconductor, can advantageously be greatly lowered. In regard to the further detailed content of wafer level CSP, please refer to the "Nikkei BP Company publication, Nikkei Micro-device, 1998 August Issue, Pages 44 to 71."

On the one hand, in a wafer level CSP, in the same manner as in a conventional CSP type semiconductor device, there are problems in mounting reliability in relation to the printed circuit board. In thermal cycle tests of this type of semiconductor device, cracks are generated in the junction portion of the external connecting terminals of the printed circuit board, and there are instances when the junction is open and defective. The main cause is stress based on linear expansion coefficient differences between the semiconductor chip made of silicon and the printed circuit board made of FR4 or the like, and a means that relieves this must be devised in the design for a wafer level CSP.

Thus, as a method that absorbs the linear expansion coefficient difference between the above-mentioned semiconductor chip and the printed circuit board, and by this means relieves the stress, a construction has been proposed wherein a metallic supporting post is formed on the wiring pattern of the semiconductor chip main face, and an external connecting terminal comprising a solder ball or the like is bonded on top of the said supporting post. In said semiconductor device, the main face of the above-mentioned semiconductor chip and the surrounding of the supporting post are covered by resin. Due to the fact that the above-mentioned supporting post is interposed between the external connecting terminal that is directly bonded to the printed circuit board and the semiconductor chip, the generation of the above-mentioned stress can be relieved by means of deformation of said supporting post element.

However, a semiconductor device that is equipped with the above-mentioned metallic supporting posts has the following types of problems.

(1) Time and expense are required in forming the metallic supporting posts on the main face of the semiconductor chip. In other words, the above-mentioned metallic supporting posts are formed by means of accumulating a metal plating (for example, copper plating) on the wiring pattern. In order to relieve the above-mentioned stress, it is necessary for said supporting posts to have a height of more than 100 $\mu$m, and more than two h are required to form these supporting posts by means of the plating method. In order to further improve the mounting reliability for the semiconductor device, it is necessary to further heighten the supporting posts, (for example, to more than 200 $\mu$m), and realization of that is extremely difficult from the aspects of time and cost.

(2) In the case of forming the metallic supporting posts by means of a plating method, because their shape and material cannot be freely selected, the degree of freedom for the design of the target package is limited.

Therefore, the objective of this invention, in a semiconductor device referred to as a wafer level CSP, is to improve its productivity while ensuring its mounting reliability.

SUMMARY OF INVENTION

In order to achieve the above-mentioned objective, the semiconductor device of this invention has a semiconductor chip having electrode pads that are electrically connected to electrical circuits that are formed on the main surface of a semiconductor substrate, conductive supporting posts of nearly spherical shape that are provided on the above-mentioned semiconductor chip and which are electrically connected to the above-mentioned electrode pads, resin that is formed so that the sections of the above-mentioned electrode supporting posts are exposed on the above-mentioned semiconductor chip, and external connecting terminals that are provided on the tips of the above-mentioned conductive supporting posts.

In a preferred embodiment configuration, the above-mentioned electrode pads and the above-mentioned conductive supporting posts are electrically connected by means of wiring that is formed on above-mentioned semiconductor chip. Also, it is preferable that the above-mentioned external connecting terminals be solder balls, and more preferably, that the above-mentioned conductive supporting posts be constructed by means of nearly spherical copper balls and solder that covers the surface of said copper balls. Furthermore, it is preferable that the height of the above-mentioned conductive supporting posts be more than 200 $\mu$m.

Also, the manufacturing method for a semiconductor device of this invention has a process that prepares a wafer on which semiconductor elements are formed having electrical circuits and electrode pads that are electrically connected to said electrical circuits, a process that forms wiring for the purpose of connecting external connecting terminals and the above-mentioned electrode pads on the above-mentioned semiconductor elements, a process that connects preformed conductive supporting posts to prescribed positions of the above-mentioned wiring, a process that forms resin so that the tips of the above-mentioned conductive supporting posts on the above-mentioned semiconductor element are exposed, a process that forms external connecting terminals on the tips of the above-mentioned conductive supporting posts, and a process that produces semiconductor devices on which external connecting terminals are formed by dicing the above-mentioned wafer.

Also, it is preferable that the process that forms the above-mentioned resin contains a process that supplies a flexible resin on top of the above-mentioned semiconductor chip and cures it, and a process that exposes the tips of the above-mentioned conductive supporting posts by grinding the upper section of the surface of the above-mentioned resin and the upper portion of the above-mentioned conductive supporting posts.

In this invention, since the forming of the supporting posts for the purpose of the external connecting terminals can be done by carrying and connecting conductive supporting posts to the desired positions of the wiring, supporting posts of the target height can be obtained in an extremely short time compared to that required for forming of supporting posts by means of the plating method used in the past. By this means, a degree of freedom in the design of the supporting posts [can be obtained], and in that way, supporting posts of sufficient dimensions, shape, and materials necessary for obtaining mounting reliability for the package can be obtained.

Also, it is preferable that the above-mentioned conductive supporting posts be constructed by means of nearly spherical copper balls and solder that covers the surface of said copper balls, and it is preferable that the process that connects the above-mentioned conductive supporting posts contain a process that carries the above-mentioned conductive supporting posts to prescribed positions on the above-mentioned wiring, and a process that connects said conductive supporting posts to prescribed positions of the above-mentioned wiring by melting the surface solder of the above-mentioned conductive supporting posts. Furthermore, it is preferable that the process that forms the above-mentioned external connecting terminals contain a process that carries solder balls to the tips of the above-mentioned conductive supporting posts, and a process that connects said solder balls to the above-mentioned conductive supporting posts by melting the above-mentioned solder balls.

REFERENCE NUMERALS AND SYMBOLS AS SHOWN IN THE DRAWINGS

In the figures, 10 represents a wafer, 10a represents an electrode pad, 12 represents a photosensitive polyimide resin, 14 represents a barrier metal, 16 represents a resist, 18 represents wiring, 20 represents a precious metal layer, 32 represents a resist, 24 represents a resist, 24a represents a window, 26 represents solder paste, 28 represents a conductive ball, 30 represents a conductive supporting post, 30a represents a solder ball connecting region, 32 represents a package resin, 34 represents a solder ball, 36 represents a dicing saw, 38 represents a semiconductor device, 70 represents a semiconductor device, and 71 represents a land.

DESCRIPTION OF EMBODIMENTS

Below, an embodiment of this invention will be explained using figures. In the manufacturing method for a semiconductor device related to this embodiment, a package process is executed for a wafer on which semiconductor elements are formed, and finally, a packaged semiconductor device is obtained when the wafer is diced. The manufacturing method related to this embodiment configuration contains processes that execute necessary wiring on the surface of a wafer on which semiconductor elements are formed, connect conductive balls that are prepared by a separate process beforehand on top of this, cover the wafer surface with resin, move solder balls that are external connecting terminals, and produce individual packages by dicing the wafer along the boundary lines of the semiconductor elements. These specific processes are sequentially explained by following FIG. 1(A) to FIG. 4(R). A person within this industry probably understands that these figures are shown in an exaggerated form for the purpose of explanation. Also, in the figures, only a cross-section of a portion of the wafer (corresponding to two semiconductor devices) is shown, but by following each process shown in the figures, the fact that the processes that are explained below are executed across the entire region of the wafer is probably understood.

Before each of the illustrated processes, normal wafer processes are executed, and semiconductor elements that are arrayed in a matrix form are formed on the surface of the silicon wafer. Here, a single circuit pattern on the wafer that is formed corresponding to a single semiconductor device is called a semiconductor element. A plurality of electrode pads that lead out from each semiconductor element are exposed on the wafer surface, and in a later process, each of the electrode pads and external connecting terminals are electrically connected.

Figure 1A:
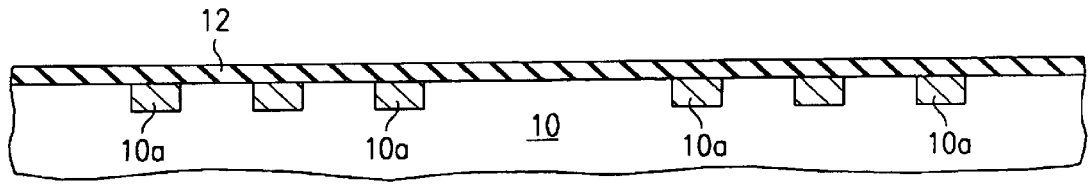
FIGS. 1(A) to 1(E) are views showing manufacturing processes for a semiconductor device related to one embodiment configuration of this invention.
Figure 1B:
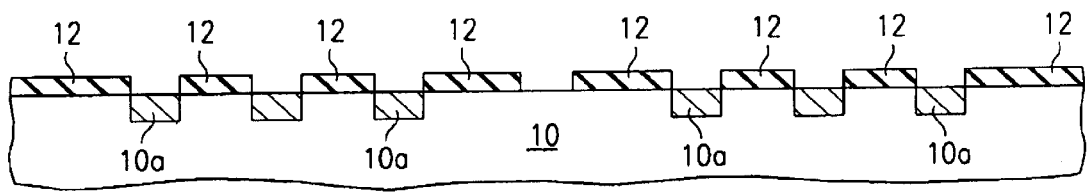
Figure 1C:
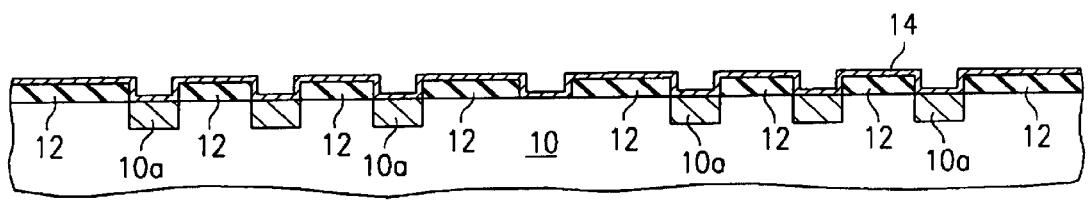
Figure 1D:
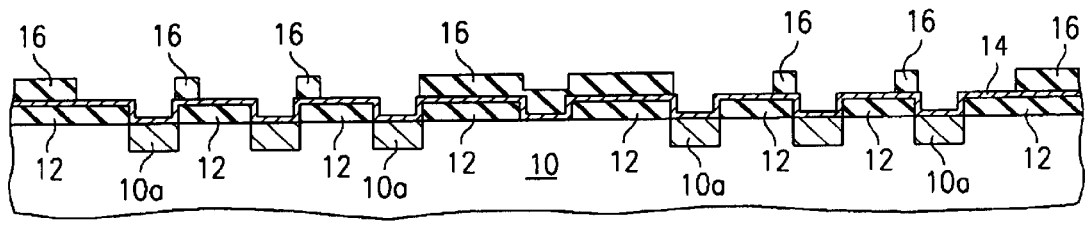
Figure 1E:
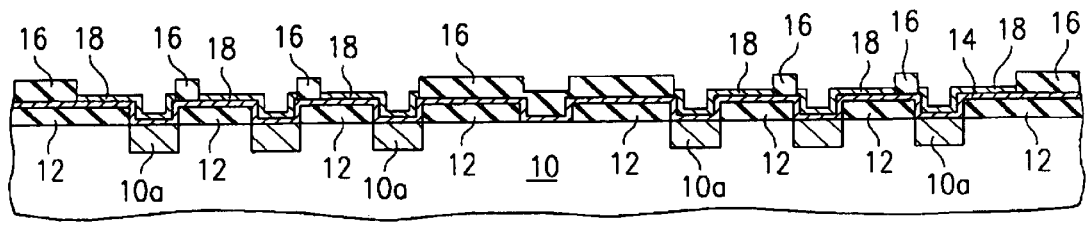

In the initial process related to the embodiment configuration shown in FIG. 1(A), on the surface of the wafer (10) on which semiconductor elements were formed by above-mentioned wafer processes, a layer (12) of a photosensitive polyimide resin is formed. This layer (12) temporarily covers the electrode pads (10a) across the entire region of the wafer (10). This layer (12) covers the surface of the comparatively brittle silicon wafer, and softens impacts that are applied from outside the completed package that are propagated to the wafer surface. Next, in the process step shown in FIG. 1(B), using a photomask, regions along the boundary lines of the regions corresponding to the electrode pads (10a) and the semiconductor elements are masked, and after the photosensitive polyimide resin is exposed, the polyimide resin on the above-mentioned regions is removed by etching.

Next, in order to form metallic wiring on the wafer, process steps of FIG. 1(C) to FIG. 2(J) are executed. First, in the process step shown in FIG. 1(C) after titanium tungsten (TiW) is deposited on the wafer surface by using an ion sputtering method, a barrier metal (14) such as chrome (Cr) or nickel (Ni) is formed on top of that. After that in the process step shown in FIG. 1(D), a resist (16) is formed by means of photolithography technology for the purpose of forming wiring, and in the process step shown in FIG. 1(E), copper (Cu) is plated on the exposed barrier metal (14), and forms the wiring (18).

Figure 2F:
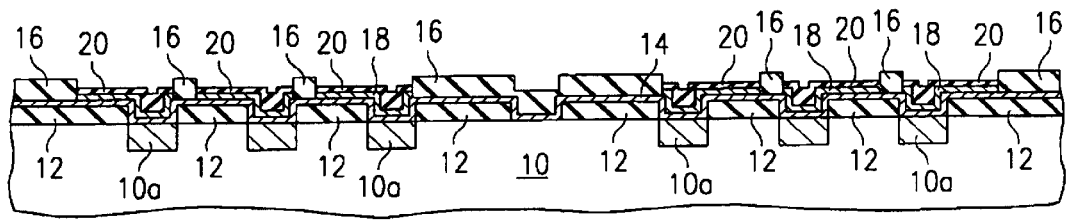
FIGS. 2(F) to 2(J) are views showing manufacturing processes for a semiconductor device related to one embodiment configuration of this invention.
Figure 2G:
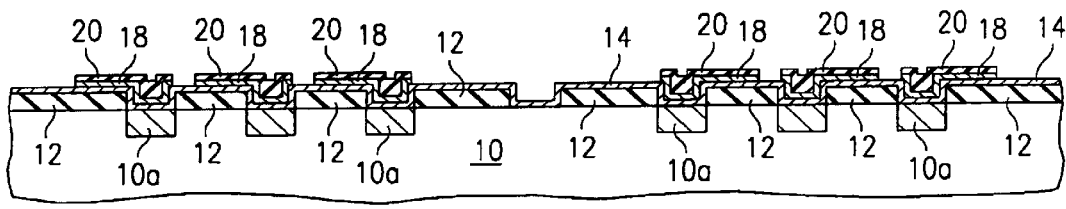
Figure 2H:
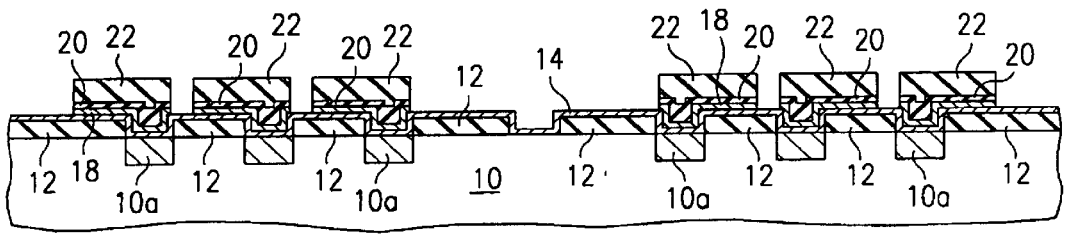
Figure 2I:
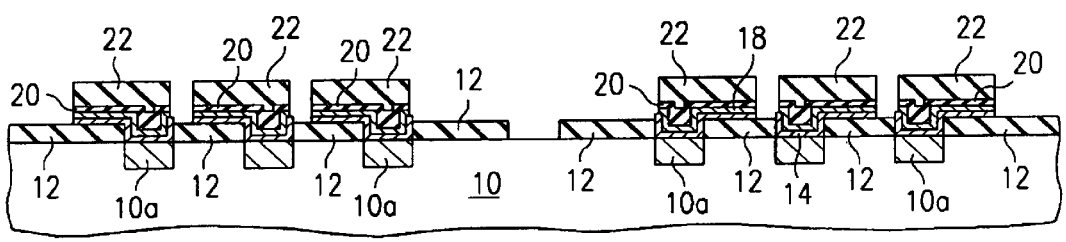
Figure 2J:
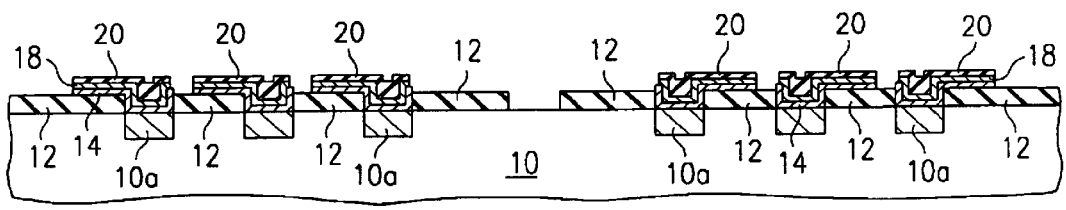

Then in the process step of FIG. 2(F), after titanium tungsten (TiW) is again deposited on the wafer surface by means of an ion sputtering method, a layer (20) that oxidizes with difficulty such as gold (Au), palladium (Pd) or another precious metal is vapor deposited on the above-mentioned wiring (18). Next, in the process step shown in FIG. 2(G), the above-mentioned resist (16) is removed, and in the process step shown in FIG. 2(H), a resist (22) is again formed by means of photolithography technology on top of that for the purpose of conducting metal etching. Then, in the process step shown in FIG. 2(I) etching of the barrier metal (14) outside the wiring sections is conducted, and in the process step shown in FIG. 2(J)), removal of the resist (22) is again conducted. Through the above processes, wiring (18) is formed for the purpose of connecting conductive supporting posts on the wafer (10) and external connecting terminals.

Next, in order to form conductive supporting posts on the above-mentioned wiring (18), the processes shown in FIGS. 3(K) to 3(N) are executed. In the manufacturing method of this invention, in order to form the conductive supporting posts on the wiring (18), conductive balls (28) that are prepared by a separate process are used. The conductive balls, along with being connected to the wiring (18) and the solder balls (34) that are the later explained external connecting terminals, function so as to relieve the stress due to linear expansion coefficient differences between the wiring side (in other words, the semiconductor chip) and the solder ball side (in other words, the printed circuit board) that can be generated when the package is mounted on the printed circuit board. These conductive balls are formed by a separate process, moved onto the wafer, and the conductive supporting posts are formed by means of connecting these to the wiring (18). In one embodiment configuration, for the conductive balls, spherical ones can be used in which copper is used as a core, and the surface is covered by solder.

As will be explained later, a conductive ball with this type of construction provides an excellent connection between the wiring and the external connecting terminal by means of the solder on the outer side and prevents reflow destruction of the shape by means of the copper core. Because of this latter feature, as long as the connectivity of the wiring and the external connecting terminals is maintained, it is probably all right even if the conductive balls are formed with a highly conductive material such as copper. In this case, the conductive balls are connected to the wiring by using a solder paste. Also, as long as a constant shape is maintained, in other words, as long as the shape is not greatly damaged after mounting, it is probably all right if the entire body is formed of solder. Also, for the metal core of the conductive ball, a metal other than copper can be used as long as it is a metal with a low diffusion coefficient in relation to solder, In one embodiment configuration, the thickness of the solder around the copper is about 20 pm.

Figure 3K:
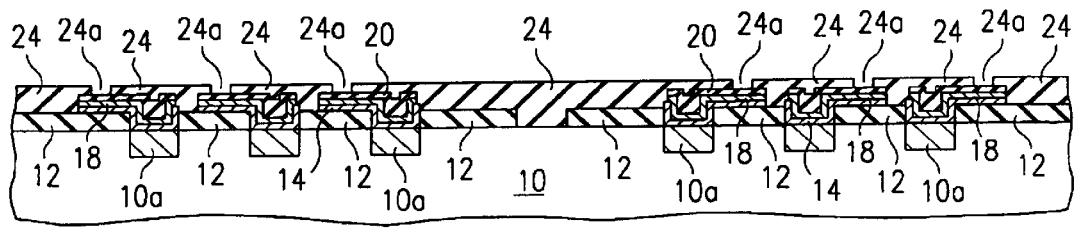
FIGS. 3(K) to 3(N) are views showing manufacturing processes for a semiconductor device related to one embodiment configuration of this invention.
Figure 3L:
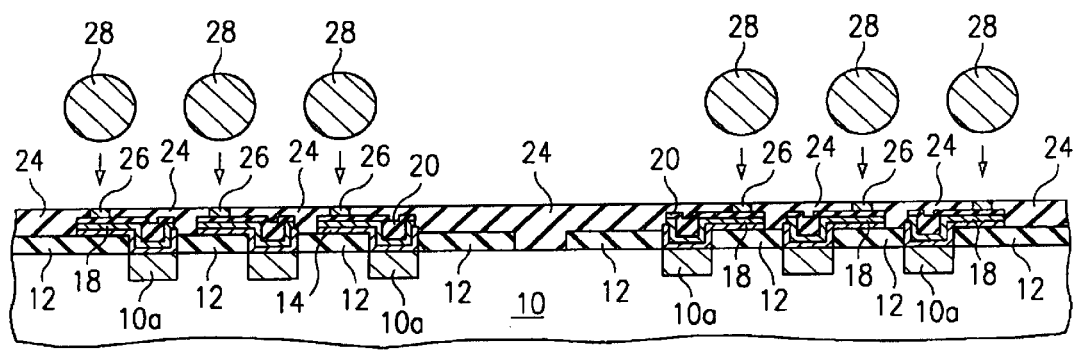
Figure 3M:
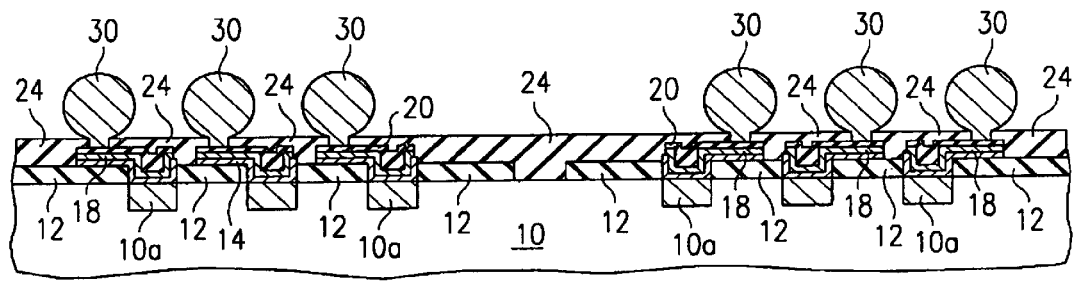
Figure 3N:
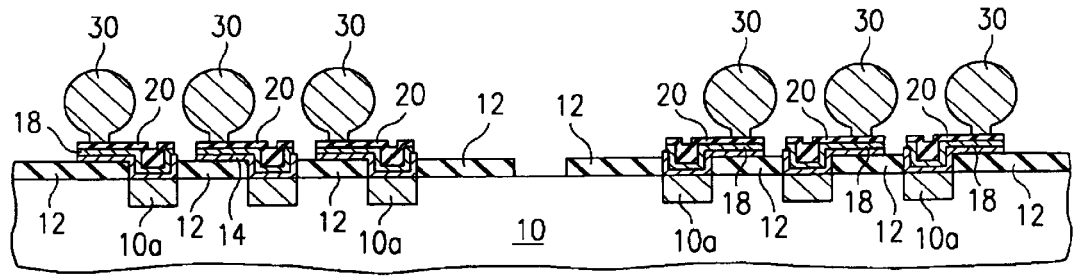
Figure 4O:
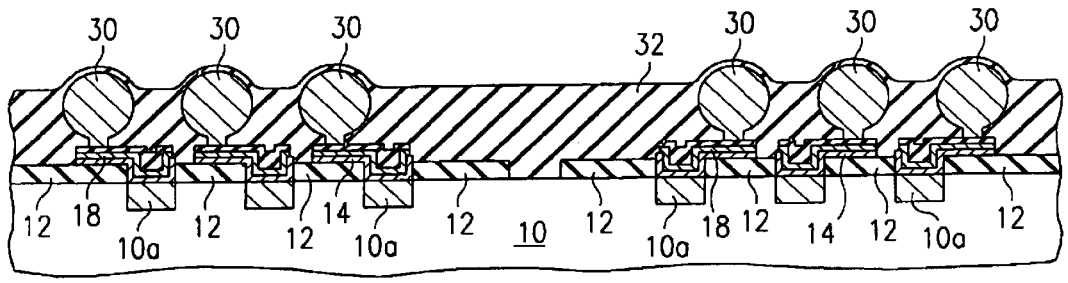
FIGS. 4(O) to 4(R) are views showing manufacturing processes for a semiconductor device related to one embodiment configuration of this invention.
Figure 4P:
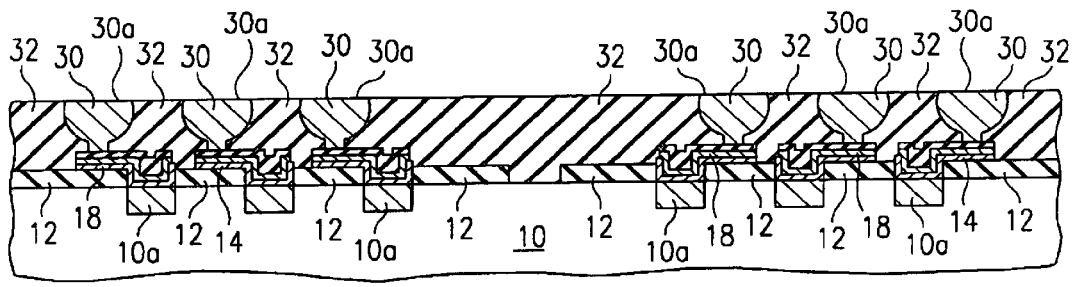
Figure 4Q:
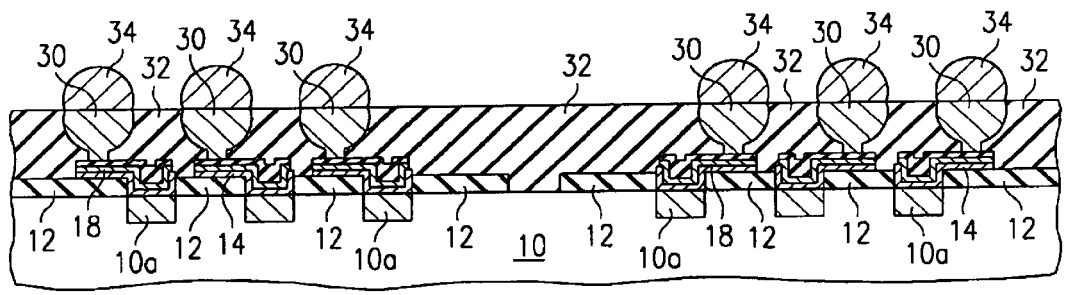
Figure 4R:
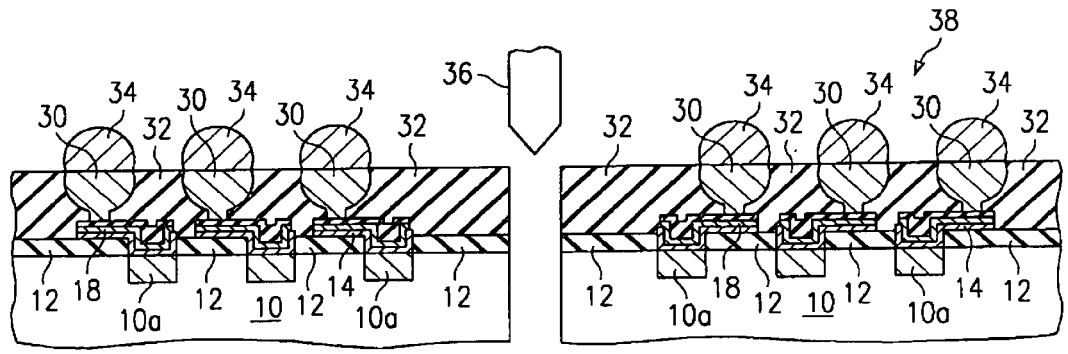

First, in the process step shown in FIG. 3(K), before connecting said conductive balls, windows (24a) are formed by means of resist (24) at their positions. In other words, resist (24) is formed so as to cover the wiring (18) on the wafer, and only the portions for the windows (24a) are removed by means of photolithography technology. By this means, the wiring is exposed at the positions of the windows (24a), to which the conductive balls are connected. Next in the process step shown in FIG. 3(L), solder paste (26) is supplied by screen printing to said windows (24a). Continuing, the conductive balls (28) that have been prepared beforehand are grasped by means of a not illustrated handle, and carried on top of the windows (24a). Then, the solder on the ball surface and the solder paste (26) are fused by means of an en bloc reflow and connected on top of the wiring (18), and spherical conductive supporting posts are obtained.

A specialist can probably understand that the mounting method for solder balls that are used as external connecting terminals in a BGA (ball grid array) and similar methods can also be used here. A large number of conductive balls (28) can be grasped at one time by means of a prescribed attachment tool, and after flux is transferred to the bottom face, the conductive balls are moved on top of the windows (24a). In this condition, the wafer (10) passes through a reflow furnace, and the solder on the surface of each conductive ball (28) and the solder paste (26) within the windows (24a) are fused, and the conductive balls (28) can be connected on top of the wiring (18). In one embodiment, the reflow is conducted under the conditions of a temperature of 240° C. maximum, and a belt speed of 0.5 m/min. In this case, the time required for executing the processes shown in FIGS. 3(L) to 3(M) was about 10 min. In the next process step shown in FIG. 3(N) the resist (24) that covers the surface of the wafer (10) is removed, and by this means, the conductive supporting posts (30) are formed on top of the wiring.

After connecting the conductive balls (28), in process (O) of FIG. 4, package resin (32) is supplied on top of the wafer (10), and is uniformly spread on the entire surface region. The height of the package resin (32) such as to entirely cover the conductive supporting posts (30), or as in the figure, is left in a small region in the upper portion of the conductive supporting posts (30). In order to uniformly supply the package resin (32) on top of the wafer, a spin coating method, a screen printing method, or other methods for supplying the resin can be used. Also, a liquid or gel form resin (32) can be cured by means of a fixed time curing. At the time of reduction to practice of this invention, the package resin (32), preferably, is a photosensitive polyimide resin. Next, at process (P), the entire surface of the package resin (32) is flattened by grinding or polishing by using a grinder or other grinding device. At this time, the upper portions of the conductive supporting posts (30) are also ground, and by this means, the conductive supporting posts (30) are exposed, and smooth circular regions (30a) are formed here. For the conductive balls (28), in the case of using copper as a core and covering this with solder, by means of grinding or polishing that surface, preferably, the copper of the inner section is exposed as a portion of the region (30a). In a preferred embodiment configuration, the diameter of the conductive balls (28) that are used is, for example, 400 μm, and after connecting these on top of the wiring, the remaining ball height when the above-mentioned grinding is conducted is more than 200 μm, and preferably, less than 300 μm.

Next, in order to conduct the connection of the solder ball (34) used as the external connecting terminal, the process (Q) of FIG. 4 is executed. In the same manner as in the previous processes (K) to (M), after a resist is painted on top of the surface of the above-mentioned ground wafer, it is removed on top of the smooth regions of the above-mentioned conductive supporting posts by means of etching, and here, the solder paste is filled in by means of a screen printing method. Next, the solder balls (34) that have been formed in a separate process are moved on top of the smooth regions (30a), and affixed by means of an en bloc reflow. The solder balls (34) are fused on top of the smooth regions (30a) by means of the reflow, and are firmly bonded through the medium of the broad contact area of these regions (30a). Continuing, in process (R), the wafer (10) is diced using a dicing saw (36), and packaged semiconductor devices (38) are obtained.

Above, embodiment configurations of this invention were explained following the figures. The application range of this invention is only limited by the description of the patent claims, and the fact that it is not limited to the facts shown in the above-mentioned embodiment examples is clear. In the above-mentioned mounting configuration, a nearly spherical conductive ball was used for the purpose of forming a conductive supporting pose. As long as it follows the purpose of this invention, to the extent that it is manufactured by separate processes, its shape can be cylindrical, conical, square post, elliptical post, or the like.

As in the above, according to this invention, the productivity and costs for a semiconductor device referred to as a wafer level CSP, which are a problem because of the plating method used in the past, can be improved, while mounting reliability is maintained.

Also, according to the manufacturing method of this invention, since conductive supporting posts having a height of more than 200 μm can be easily obtained, the suppression of the generation of stress that originates from the linear expansion coefficient differences between elements becomes simple, and the mounting reliability for this type of semiconductor device can be improved.

What is claimed is:

1. A manufacturing method for a semiconductor device having
   a process that prepares a wafer on which semiconductor elements are formed having electrical circuits and electrode pads that are electrically connected to said electrical circuits,
   a process that forms wiring for the purpose of connecting external connecting terminals and the above-mentioned electrode pads on the above-mentioned semiconductor elements,
   a process that connects preformed conductive supporting posts to prescribed positions of the above-mentioned wiring, said supporting posts comprising solder,
   a process that forms resin so that the tips of the above-mention conductive supporting posts on the above-mentioned semiconductor element are exposed,
   a process that forms external connecting terminals on the tips of the above-mentioned conductive supporting posts,
   and a process that produces semiconductor devices on which external connecting terminals are formed by dicing the above-mentioned wafer,
   wherein the above-mentioned conductive supporting posts are formed by means of nearly spherical copper balls and solder that covers the surface of said copper balls.

2. A manufacturing method for a semiconductor device according to claim 1 wherein the above-mentioned process that forms the above-mentioned resin includes a process that supplies a resin to the above-mentioned semiconductor chip and cures it, and a process that exposes the tip sections of the above-mentioned conductive supporting posts by grinding the surface of the above-mentioned resin and the upper portion of the above-mentioned conductive supporting posts.

3. A manufacturing method for a semiconductor device according to claim 2 wherein the above-mentioned process that connects the conductive supporting posts includes a process that carries the above-mentioned conductive supporting posts to prescribed positions on the above-mentioned wiring, and a process that connects said conductive supporting posts to desired positions for the above-mentioned wiring by melting the solder of the surface of the above-mentioned conductive supporting posts.

4. A manufacturing method for a semiconductor device having
   a process that prepares a wafer on which semiconductor elements are formed having electrical circuits and electrode pads that are electrically connected to said electrical circuits,
   a process that forms wiring for the purpose of connecting external connecting terminals and the above-mentioned electrode pads on the above-mentioned semiconductor elements,
   a process that connects preformed conductive supporting posts to prescribed positions of the above-mentioned wiring, said supporting posts comprising solder,
   a process that forms resin so that the tips of the above-mentioned conductive supporting posts on the above-mentioned semiconductor element are exposed,
   a process that forms external connecting terminals on the tips of the above-mentioned conductive supporting posts,
   and a process that produces semiconductor devices on which external connecting terminals are formed by dicing the above-mentioned wafer.
   wherein the above-mentioned process that forms the external connecting terminals includes a process that carries solder balls to the tips of the above-mentioned conductive supporting posts, and a process that connects said solder balls to the above-mentioned conductive supporting posts by melting the above-mentioned solder balls.

5. A method for manufacturing a semiconductor device, comprising the steps of:
   providing a semiconductor chip having electrode pads electrically connected to electrical circuits formed on the main surface of a semiconductor substrate;
   connecting solder supporting post to the electrode pads; and forming an insulating layer to surround the solder supporting posts such that a top portion of said solder supporting posts is not covered by said insulating layer, wherein said step of connecting solder supporting posts comprises connecting solder supporting posts having supporting a non-solder core ball.

6. The method of claim 5, further comprising the step of connecting said electrode pads and said solder conductive supporting posts by wiring on the semiconductor chip.

7. The method of claim 5, wherein said step of forming an insulating layer comprises the steps of depositing said insulating layer and then planarizing the deposited layer.

8. The method of claim 5, wherein said solder conductive supporting posts have a height greater than 200 $\mu$m.

9. The method of claim 5, further comprising the step of attaching solder balls to said solder conductive supporting posts.

* * * * *